(12) United States Patent
Peled et al.

(10) Patent No.: US 10,699,969 B2
(45) Date of Patent: Jun. 30, 2020

(54) QUICK ADJUSTMENT OF METROLOGY MEASUREMENT PARAMETERS ACCORDING TO PROCESS VARIATION

(71) Applicant: KLA-TENCOR CORPORATION, Milpitas, CA (US)

(72) Inventors: Einat Peled, Haifa (IL); Eran Amit, Haifa (IL); Alexander Svizher, Haifa (IL); Yuval Lamhot, Haifa (IL); Noga Sella, Migdal Haernek (IL); Wei-Te Cheng, Taichung (TW)

(73) Assignee: KLA-Tencor Corporation, Milpitas, CA (US)

( * ) Notice: Subject to any disclaimer, the term of this patent is extended or adjusted under 35 U.S.C. 154(b) by 4 days.

(21) Appl. No.: 15/774,025

(22) PCT Filed: Apr. 5, 2018

(86) PCT No.: PCT/US2018/026157
§ 371 (c)(1),
(2) Date: May 7, 2018

(87) PCT Pub. No.: WO2019/045780
PCT Pub. Date: Mar. 7, 2019

(65) Prior Publication Data
US 2019/0074227 A1 Mar. 7, 2019

Related U.S. Application Data

(60) Provisional application No. 62/591,101, filed on Nov. 27, 2017, provisional application No. 62/552,366, filed on Aug. 30, 2017.

(51) Int. Cl.
*H01L 21/66* (2006.01)
*H01L 21/67* (2006.01)
*G03F 7/20* (2006.01)

(52) U.S. Cl.
CPC .......... *H01L 22/12* (2013.01); *G03F 7/70616* (2013.01); *G03F 7/70625* (2013.01);
(Continued)

(58) Field of Classification Search
CPC ... H01L 22/12; H01L 22/26; H01L 21/67253; G03F 7/70616; G03F 7/70625; G03F 7/70633
See application file for complete search history.

(56) References Cited

U.S. PATENT DOCUMENTS 6,834,213 B1   12/2004   Sonderman et al.
7,265,669 B2 *  9/2007   Call ..................... G01N 1/2208
                                                   340/506

(Continued)

OTHER PUBLICATIONS

ISA/KR, International Search Report for PCT/US2018/026157 dated Jul. 27, 2018.

*Primary Examiner* — Charles R Kasenge
(74) *Attorney, Agent, or Firm* — Hodgson Russ LLP

(57) ABSTRACT

Methods applicable in metrology modules and tools are provided, which enable adjusting metrology measurement parameters with respect to process variation, without re-initiating metrology recipe setup. Methods comprise, during an initial metrology recipe setup, recording a metrology process window and deriving baseline information therefrom, and during operation, quantifying the process variation with respect to the baseline information, and adjusting the metrology measurement parameters within the metrology process window with respect to the quantified process variation. The quick adjustment of metrology parameters avoids metrology-related process delays and releases prior art bottlenecks related thereto. Models of effects of various process variation factors on the metrology measurements may be used to enhance the derivation of required metrology (Continued)

tuning and enable their application with minimal delays to the production process.

14 Claims, 8 Drawing Sheets

(52) U.S. Cl.
CPC .... *G03F 7/70633* (2013.01); *H01L 21/67253* (2013.01); *H01L 22/26* (2013.01)

(56) References Cited

U.S. PATENT DOCUMENTS

| | | | |
|---|---|---|---|
| 9,377,481 B1* | 6/2016 | Greenberg | G01P 5/001 |
| 2002/0093648 A1* | 7/2002 | Nikoonahad | G01N 21/211 |
| | | | 356/237.1 |
| 2002/0097406 A1* | 7/2002 | Fielden | G01N 21/211 |
| | | | 356/630 |
| 2004/0232052 A1* | 11/2004 | Call | B01D 21/2455 |
| | | | 209/143 |
| 2004/0233445 A1 | 11/2004 | Littau et al. | |
| 2005/0190058 A1* | 9/2005 | Call | G01N 1/2208 |
| | | | 340/539.26 |
| 2005/0247868 A1* | 11/2005 | Call | G01N 15/0255 |
| | | | 250/282 |
| 2006/0058979 A1* | 3/2006 | Markle | H01L 21/67276 |
| | | | 702/155 |
| 2007/0002298 A1* | 1/2007 | Visser | G03F 9/7076 |
| | | | 355/55 |
| 2008/0018887 A1* | 1/2008 | Chen | G01N 21/47 |
| | | | 356/237.2 |
| 2009/0319214 A1* | 12/2009 | Tian | G01B 11/24 |
| | | | 702/82 |
| 2010/0198556 A1 | 8/2010 | Kost | |
| 2012/0208301 A1* | 8/2012 | Izikson | G05B 21/02 |
| | | | 438/5 |
| 2013/0035888 A1* | 2/2013 | Kandel | G03F 7/70633 |
| | | | 702/81 |
| 2013/0110477 A1 | 5/2013 | Pandev | |
| 2016/0042105 A1* | 2/2016 | Adel | G06F 17/5009 |
| | | | 703/6 |
| 2016/0290796 A1 | 10/2016 | Levy et al. | |
| 2016/0313658 A1 | 10/2016 | Marciano et al. | |

* cited by examiner

QUICK ADJUSTMENT OF METROLOGY MEASUREMENT PARAMETERS ACCORDING TO PROCESS VARIATION

CROSS REFERENCE TO RELATED APPLICATIONS

This application claims the benefit of U.S. Provisional Patent Application No. 62/552,366 filed on Aug. 30, 2017, which is incorporated herein by reference in its entirety. This application also claims the benefit of U.S. Provisional Patent Application No. 62/591,101 filed on Nov. 27, 2017, which is also incorporated herein by reference in its entirety.

BACKGROUND OF THE INVENTION

1. Technical Field

The present invention relates to the field of metrology, and more particularly, to adjustment of metrology procedures to reduce delays.

2. Discussion of Related Art

Metrology measurements are crucial in the photolithography production process, yet may cause unacceptable delays in the process, especially when being increasingly influenced by process variation as the process node size is reduced.

SUMMARY OF THE INVENTION

The following is a simplified summary providing an initial understanding of the invention. The summary does not necessarily identify key elements nor limits the scope of the invention, but merely serves as an introduction to the following description.

One aspect of the present invention provides a method of adjusting metrology measurement parameters with respect to process variation, without re-initiating metrology recipe setup, the method comprising: during an initial metrology recipe setup, recording a metrology process window and deriving baseline information therefrom, and during operation, quantifying the process variation with respect to the baseline information, and adjusting the metrology measurement parameters within the metrology process window with respect to the quantified process variation.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1:
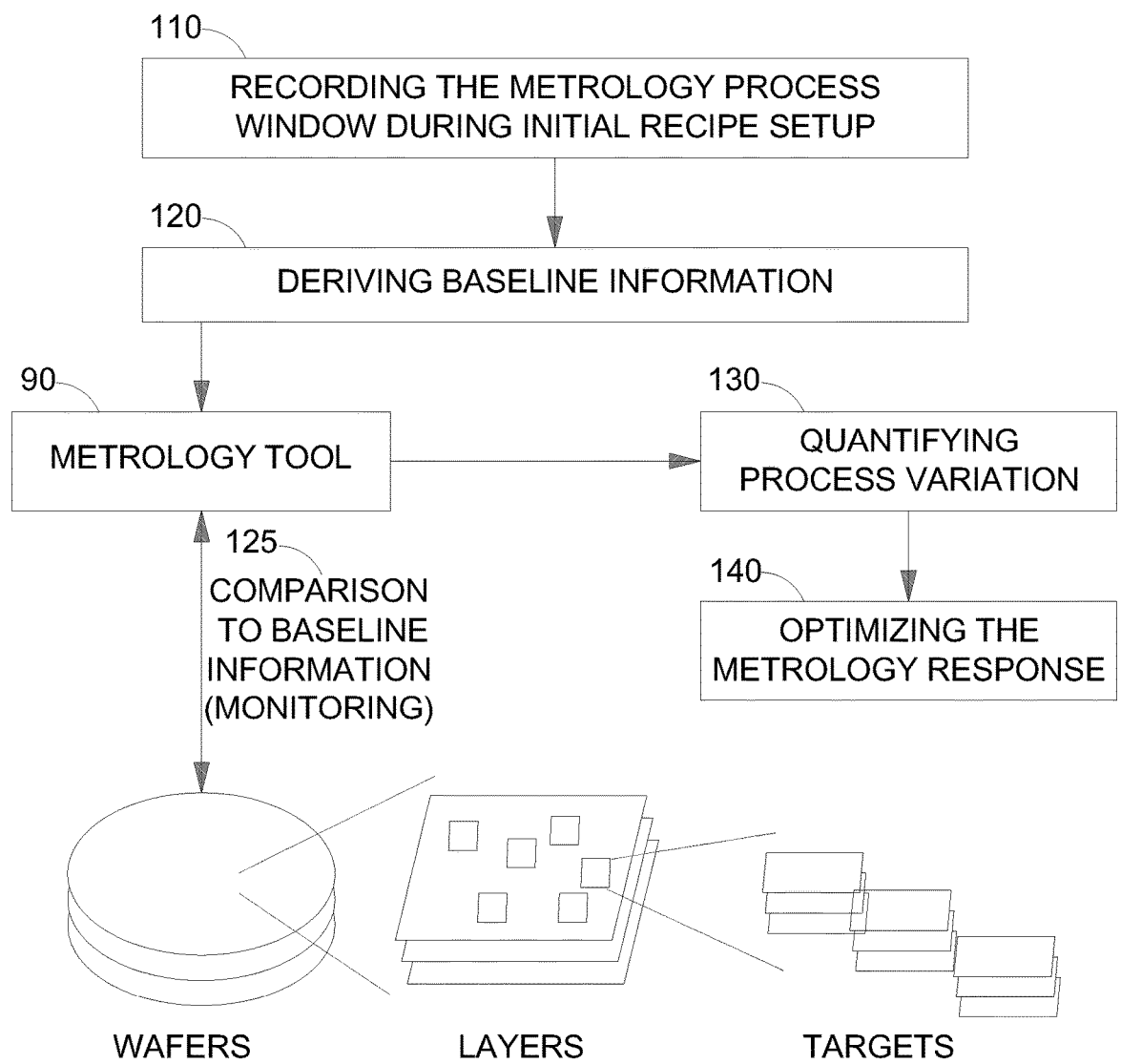
FIG. 1 is a high level schematic illustration of a metrology optimization method, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein are for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing", "deriving", "optimizing", "adjusting" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Embodiments of the present invention provide efficient and economical methods and mechanisms for adjusting metrology measurement parameters according to detected process variation, and thereby provide improvements to the technological field of photolithographic production.

Methods applicable in metrology modules and tools are provided, which enable adjusting metrology measurement parameters with respect to process variation, without re-initiating metrology recipe setup. Methods comprise, during an initial metrology recipe setup, recording a metrology process window and deriving baseline information therefrom, and during operation, quantifying the process variation with respect to the baseline information, and adjusting the metrology measurement parameters within the metrology process window with respect to the quantified process variation. The quick adjustment of metrology parameters avoids metrology-related process delays and releases prior art bottlenecks related thereto. Models of effects of various process variation factors on the metrology measurements may be used to enhance the derivation of required metrology tuning and enable their application with minimal delays to the production process, as disclosed below.

Figure 2:
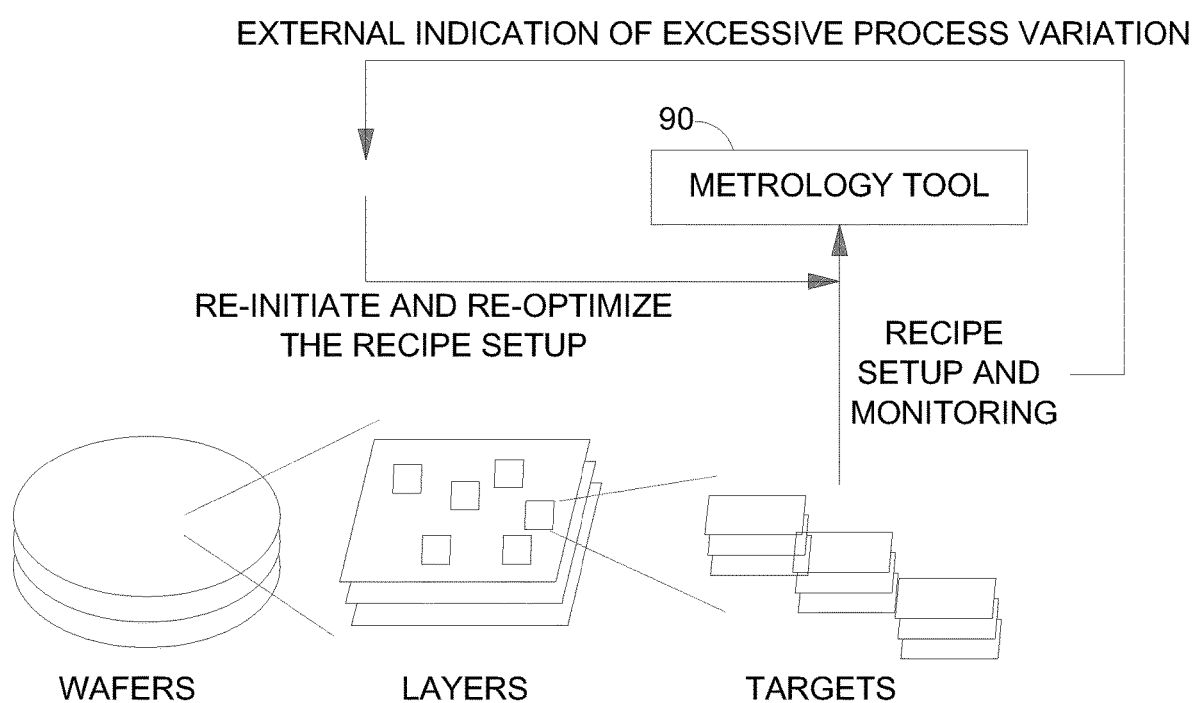
FIG. 2 is a high level schematic illustration of prior art metrology setup procedures.

FIG. 1 is a high level schematic illustration of a metrology optimization method 100, according to some embodiments of the invention. FIG. 2 is a high level schematic illustration of prior art metrology setup procedures.

In the prior art (as illustrated schematically in FIG. 2), metrology recipe setups are carried out prior to metrology measurements of the metrology targets to optimize the measurement conditions with respect to the specific layer that is to be measured. During the standard production mode, flags are monitored to quantify the process variation, and in case the excessive process variation is indicated, e.g., by external feedback from a client, possibly with respect to the thresholds defined by the flags—the recipe setup is reinitiated to re-optimize the metrology recipe. As the recipe setup is a time-consuming procedure, process variation may cause delays in the manufacturing process due to metrology unavailability.

In the disclosed invention (illustrated schematically in FIG. 1), metrology optimization method 100 provides a different approach that prevents such prior art delays. In an initial recipe setup procedure, the metrology process window is recorded (stage 110). The metrology process window may be expressed by various ways that quantify the dependency of metrology measurement results (e.g., inaccuracy metrics) on measurement parameters (e.g., wavelength(s), focus and dose etc.), such as the landscape approach disclosed e.g., in U.S. Application Publication No. 2016/0313658. It is noted that the term "landscape" as used herein in this application, is defined as a dependency of one or more metrology metric(s) or result(s) on one or more parameter, typically measurement parameter(s) related to any of process parameter(s), measurement parameter(s) e.g., illumination parameters, and target parameters. Typically, landscapes may be depicted to illustrate the dependency of the metric(s) or result(s) on the respective parameter(s) and are not limited to continuous dependencies, to analytical dependencies (expressible as functions) nor to specific ways by which the dependencies are derived (e.g., experimentally, by simulation or analytically). It is noted that any of the parameters may be understood to have discrete values or continuous values, depending on specific measurement settings. In certain embodiments, landscapes comprise an at least partially continuous dependency, or a densely sampled dependency, of at least one metrology metric on at least one recipe parameter. Examples and analysis of landscapes are disclosed e.g., in U.S. Application Publication No. 2016/0313658, which is included herein by reference in its entirety.

Method 100 further comprises deriving baseline information from the metrology process window (stage 120), to which measured parameters of new wafers are compared to quantify the process variation with respect to the metrology process window (stage 130). The quantification of the process variation is then used to optimize the metrology response (stage 140), without the prior art need to reinitiate the recipe setup, thereby sparing metrology time and avoiding delays. The quantification of the process variation with respect to the metrology process window by comparing the wafer measurements to the derived baseline information is illustrated below, in a non-limiting, demonstrative manner, using three different metric types.

Advantageously, disclosed method 100 enhances process stability for advanced process nodes as it reduced the susceptibility of the metrology to process variations, by identifying the process variations in comparison to the baseline information recorded during the initial recipe setup and adjusting the metrology tool response to the process variation with minimal or no throughput penalty.

Figure 3A:
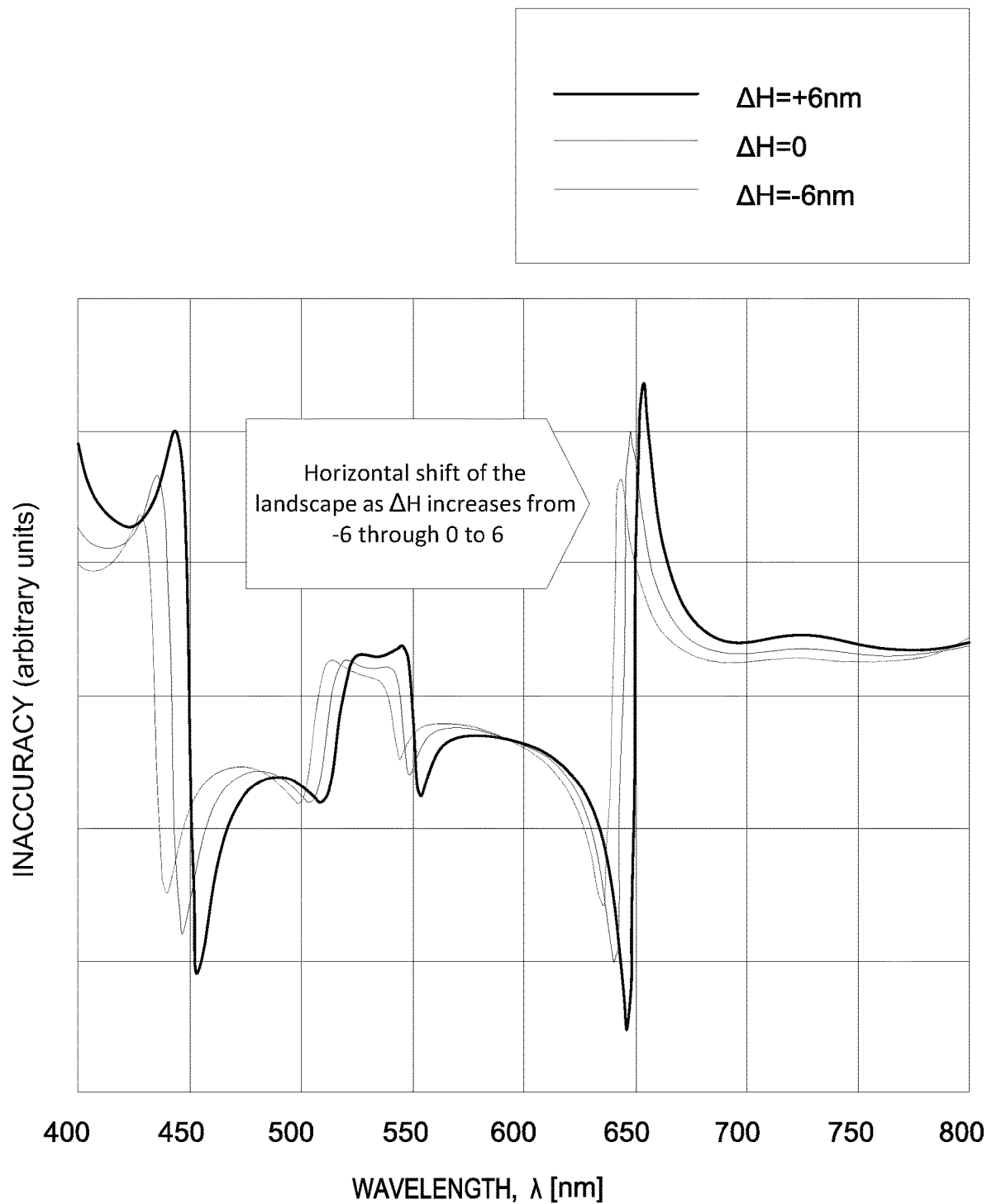
FIGS. 3A and 3B are high level schematic examples for the effects of symmetric and asymmetric process variation on the inaccuracy landscape, according to some embodiments of the invention.
Figure 3B:
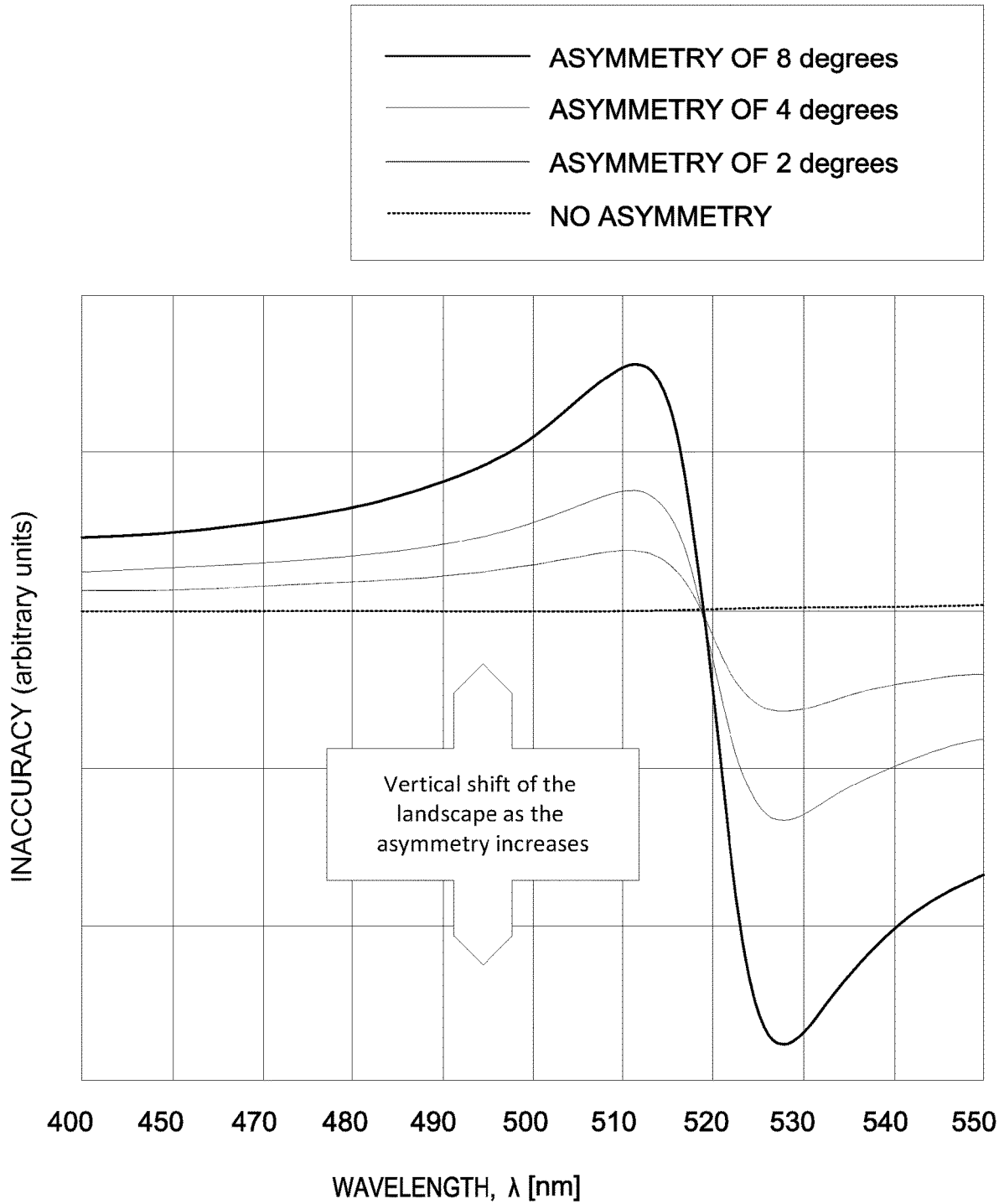

FIGS. 3A and 3B are high level schematic examples for the effects of symmetric and asymmetric process variation on the inaccuracy landscape, according to some embodiments of the invention. In the non-limiting illustrated example, the dependency of an inaccuracy metric on the illumination wavelength as measurement parameter is shown. The example refers to, but is not limited to, the measurement wavelength as a measurement parameter which has continuous values. Analysis along similar principles may be applied to measurement parameters having discrete values.

The inaccuracy metric (measurement error) may be expressed as in Equation 1, with $F_{Sym}(\lambda, \rho_t^{Sym})$ denoting the dependency of the metric on symmetric (Sym) process variations at a given wavelength $\lambda$ and process variation magnitude $\rho$ at time t. While the process variation is expressed here for simplicity purposes as a single scalar, it can be easily expanded to a vector describing multiple variations. Similarly, the function $F_{AS}(\lambda, \rho_t^{AS})$ describes the dependency of the metric on asymmetric (AS) process variations that break the target symmetry.

$$\text{Inaccuracy}(\lambda, \rho_t^{Sym}, \rho_t^{AS}) = F_{Sym}(\lambda, \rho_t^{Sym}) F_{As}(\lambda, \rho_t^{AS}) \qquad \text{Equation 1}$$

The asymmetric variation function $F_{AS}$ and the symmetric variation function $F_{Sym}$ of the Inaccuracy function may be written and approximated with respect to time zero as expressed in Equations 2, with $\tilde{F}_{AS}(\lambda)$ being an asymmetric function which depends only on the wavelength and not on the process variation magnitude and v being a multiplication factor.

$$F_{AS}(\lambda, \rho_t^{AS}) = \tilde{F}_{AS}(\lambda)\rho_t^{AS} = F_{AS}(\lambda, \rho_0^{AS})\frac{\rho_t^{AS}}{\rho_0^{AS}}; \qquad \text{Equations 2}$$

$$F_{Sym}(\lambda, \rho_t^{Sym}) = F_{Sym}\left(\lambda - v\frac{\rho_t^{Sym}}{\rho_0^{Sym}}, \rho_0^{Sym}\right)$$

FIGS. 3A and 3B illustrate simulations results which support the model provided in Equations 1 and 2. FIG. 3A illustrates that modifying a symmetric stack parameter (e.g., layer thickness as a non-limiting example) results mostly shifted the inaccuracy landscape to the right (longer wavelengths) and that modifying an asymmetric stack parameter (e.g., side wall angle, SWA, as a non-limiting example) results in a vertical stretch of the landscape, which is proportional to the asymmetry magnitude. Substituting Equations 2 into Equation 1, provides the expression for the Inaccuracy function of Equation 3.

$$\text{Inaccuracy}(\lambda, \rho_t^{Sym}, \rho_t^{AS}) = \quad \text{Equation 3}$$
$$F_{Sym}\left(\lambda - v\frac{\rho_t^{Sym}}{\rho_0^{Sym}}, \rho_0^{Sym}\right) F_{AS}(\lambda, \rho_0^{AS})\frac{\rho_t^{AS}}{\rho_0^{AS}}$$

In certain embodiments, specific metrics may be developed to indicate symmetric and asymmetric process variations in given measurements. Such metrics may be used to quantify and characterize process variation with respect to the baseline information, as described above (stage 130).

Figure 4:
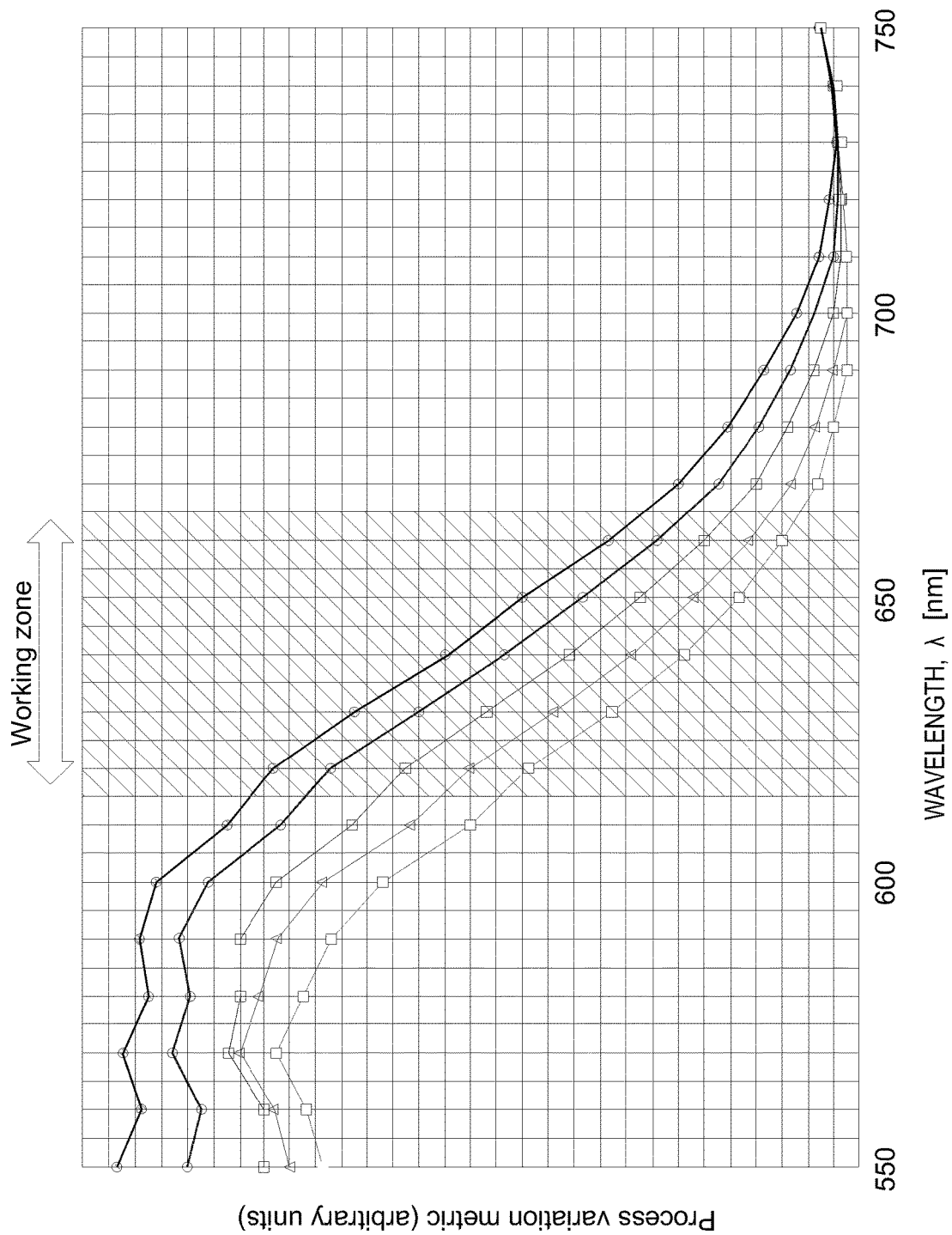
FIG. 4 is an example for a process variation metric which is sensitive to symmetric process variations in the metrology measurements, according to some embodiments of the invention.

For example, the metrics $G_{Sym}$ and $G_{AS}$ defined in Equation 4 may be used to extract the symmetric and asymmetric process variations from the measurements, as illustrated in FIG. 4.

$$\text{Inaccuracy}(\lambda, \rho_t^{Sym}, \rho_t^{AS}) = F_{Sym}(\lambda - G_{Sym}(t), \rho_0^{Sym}) F_{As}(\lambda, \rho_0^{AS}) G_{As}(t) \quad \text{Equation 4}$$

FIG. 4 is an example for a process variation metric (e.g., reflectivity as a non-limiting example) which is sensitive to symmetric process variations in the metrology measurements, according to some embodiments of the invention. Each line was measured on a wafer with a different thickness (as process variation). The prominent effect around the working point (indicated in FIG. 4 as the working zone) is the horizontal shift between the different wafer curvatures, in agreement to the expression for $F_{Sym}$ in Equations 2.

In method 100, the metrology process window may be derived during the metrology setup by studying $F_{Sym}$ and $F_{AS}$ e.g., by using multiple wavelength measurements in addition to (self) reference measurements. By monitoring $F_{Sym}$ and $F_{AS}$ within wafer and between wafers (wafer to wafer) the inaccuracy can be estimated with respect to the process variation (see stages 125, 130) and used to optimize the metrology (see stage 140). For example, the optimal wavelength may be calculated as in Equation 5, and used to perform the metrology measurements.

$$\lambda_{opt}(t) = \lambda - G_{Sym}(t) \quad \text{Equation 5}$$

Advantageously, the disclosed procedure reduces the need for multiple measurements for recipe re-optimization in the presence of small process variations, as required in the prior art (see FIG. 2).

Figure 5:
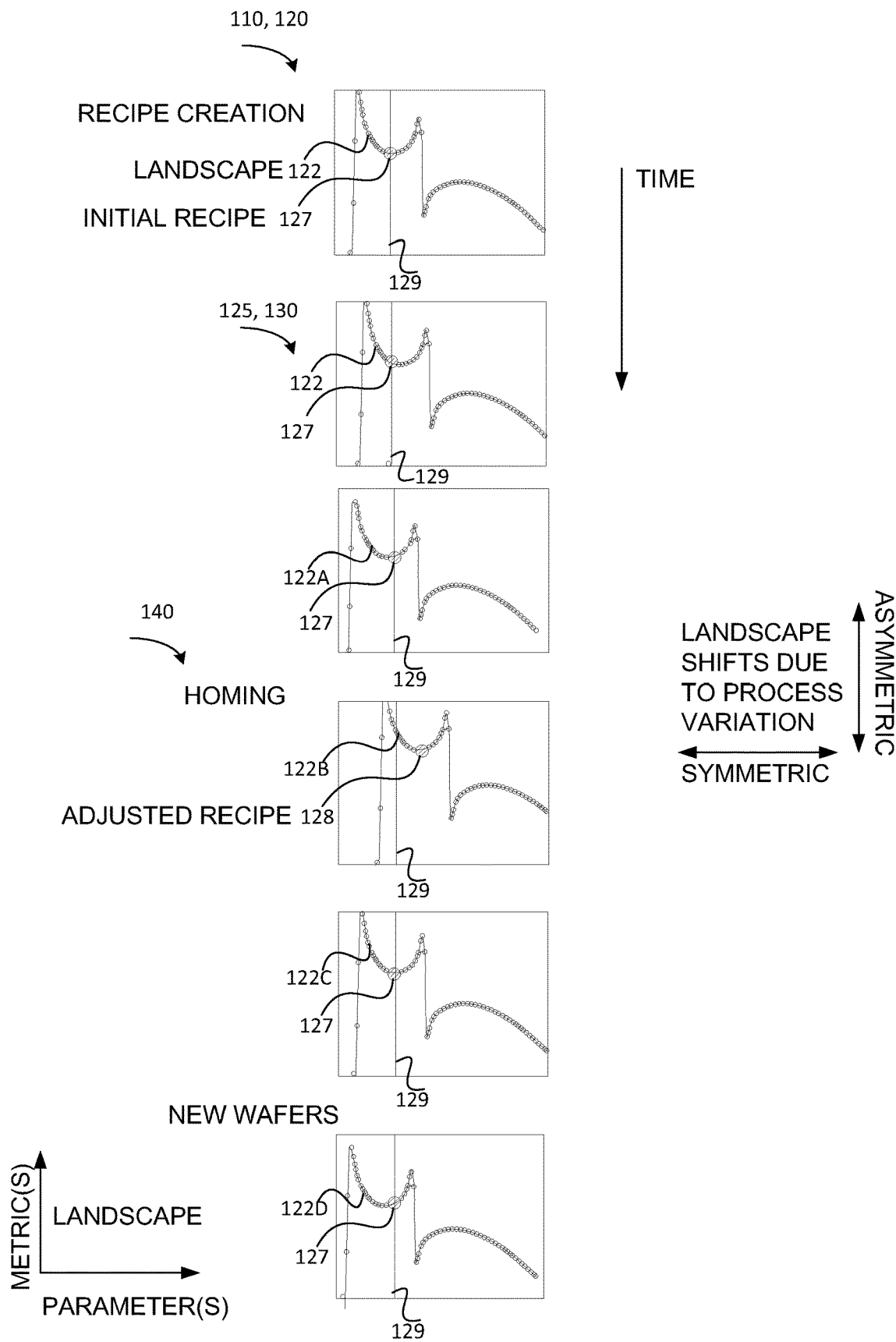
FIG. 5 is a high level schematic illustration of an example for fine tuning the metrology response, according to some embodiments of the invention.

FIG. 5 is a high level schematic illustration of an example for fine tuning the metrology response, according to some embodiments of the invention. The illustrated fine tuning is a non-limiting example for metrology response optimization 140 based on process variation characterization using the baseline information, disclosed above.

Initial recording of the process window and initial recipe creation (stage 110) are indicated by a schematic curve 122 representing an initial landscape 122 and a point 127 representing parameters of an initial recipe 127. The baseline information comprises initial landscape 122 and optionally initial recipe 127. The illustrated broken line 129 is used to indicate the original recipe parameters, as landscape 122 changes during measurements (landscape changes indicated by 122A-122D), and as recipe 127 may be changed to adjusted recipe 128 during measurements (e.g., by changing the measurement wavelength).

Over time, e.g., between wafers and/or lots (see FIG. 1), landscape 122 may be shifted (e.g., to landscapes 122A, 122B, etc.) due to process variation (see e.g., FIGS. 3A, 3B and schematic indication) resulting in corresponding drift in the metrology performance. Method 100 may comprise monitoring the landscape shift (by comparison to the baseline information 125 and quantifying the process variation 130) and adjusting the metrology parameters (see stage 140, also referred to as fine tuning or homing), shown schematically by the selection of a new point 128, representing an adjusted recipe with changed parameter(s), in landscape 122B (different from initial point 127) if the shift is too large with respect to given criteria and/or thresholds. New point 128 represents the recipe adjustment for the modified landscape due to the process variation—for example by changing a measurement parameter such as a change of the measurement wavelength. Upon further shifts of the landscape, initial recipe (point 127) may be used again, or the recipe may be further adjusted. As the measurements continue, the landscape may further change, and the recipe may be further adjusted if needed.

In certain embodiments, alternatively or complementarily, if landscape shifts are above specified thresholds (e.g., landscape 122B), process corrections may be introduced to re-establish landscape 122 (e.g., denoted landscape 122C) and possibly initial recipe 127, to enable required metrology operation conditions. The modification of the process and landscape may be carried out by external adjustment, e.g., if process errors are indicated by a user or by flags to be too large.

It is noted that new wafers may provide new landscapes 122 (indicated as landscape 122D), and disclosed method 100 provides tools to indicate the influence of the modified landscape on the metrology performance, corresponding to the relative position of recipe 127 in landscape 122D. According to the relative position, recipe 127 may be maintained, adjusted (to recipe 128) or process conditions may be modified, e.g., externally, to adjust landscape 122D. Optionally, metrology recipe set up may need to be re-optimized, in which case a new baseline landscape 122 and recipe 127 may be derived during the new optimization.

It is emphasized that landscape 122 and/or changes in landscape 122 may be determined using one or few discrete points, such as identified extrema or other predefined points, as alternative to a more elaborate landscape determination. Method 100 may further comprise indicating the required resolution for landscape determination according to the detected shifts or other process and/or metrology parameters. Landscape shifts may be used to estimate the magnitude and character of process variation—e.g., symmetric or asymmetric process variation, their relative magnitudes and/or candidate process parameters causing them. Advantageously, disclosed methods 100 provide recipe adjustment opportunities for most common process variations, thereby reducing required metrology time and enhancing metrology throughput during operation of the metrology tool.

In certain embodiments, multiple sites and/or metrics and/or wavelengths may be used to refine method 100 and enhance its accuracy and flexibility by providing a more complex evaluation of the landscape and of the process variation, e.g., stages 120, 125, 130 may be multi-parametric to enhance optimization 140.

In certain embodiments, partial analysis may also suffice to identify landscape shifts, such as functional properties of measurements, e.g., measurements of extremum(s) with respect to wavelengths. Accordingly, discrete measurements may serve as the baseline information and the quantification of process variation may be carried out in form of flags indicating such measurements of extrema.

In certain embodiments, method 100 may be further optimized using data or results concerning the typical pupil signature in pupil-imaging diffraction based overlay (DBO), field signature in either field-imaging DBO or imaging overlay or any other signature of a measure at a given wavelength (for example, using machine-learning to extract the correlation between typical signature, wavelength, symmetric and asymmetric process variations). If there are other or more continuous metrology metrics (such as focus) method 100 may be expanded to 2D (two dimensions) or even higher dimension dependency analysis (for example, using through-wavelength through-focus surfaces in imaging).

Advantageously, in certain embodiments, method 100 may be implemented using wavelength tenability to establish the baseline, and may enable fast metrology re-tuning in the presence of process variations without the need of prior art time-consuming optimization.

In certain embodiments, continuous baseline information may be used in order to carry out any of the following: (i) Quantifying symmetric and asymmetric process variations using a single wavelength measurement; (ii) Monitoring metrology quality (in the non-limiting illustrations, inaccuracy in nm); (iii) Fast optimization of metrology wavelength and/or focus back to baseline quality; (iv) Providing specific process feedback based on wavelength landscape variations using a single wavelength measurement; and (v) Fast optimization of metrology wavelength and/or focus and/or other continuous knobs (metrics) based on e.g., geometrical functionality such as extremum point, saddle point or distance from it of metrology measures vs. these knobs.

Figure 6:
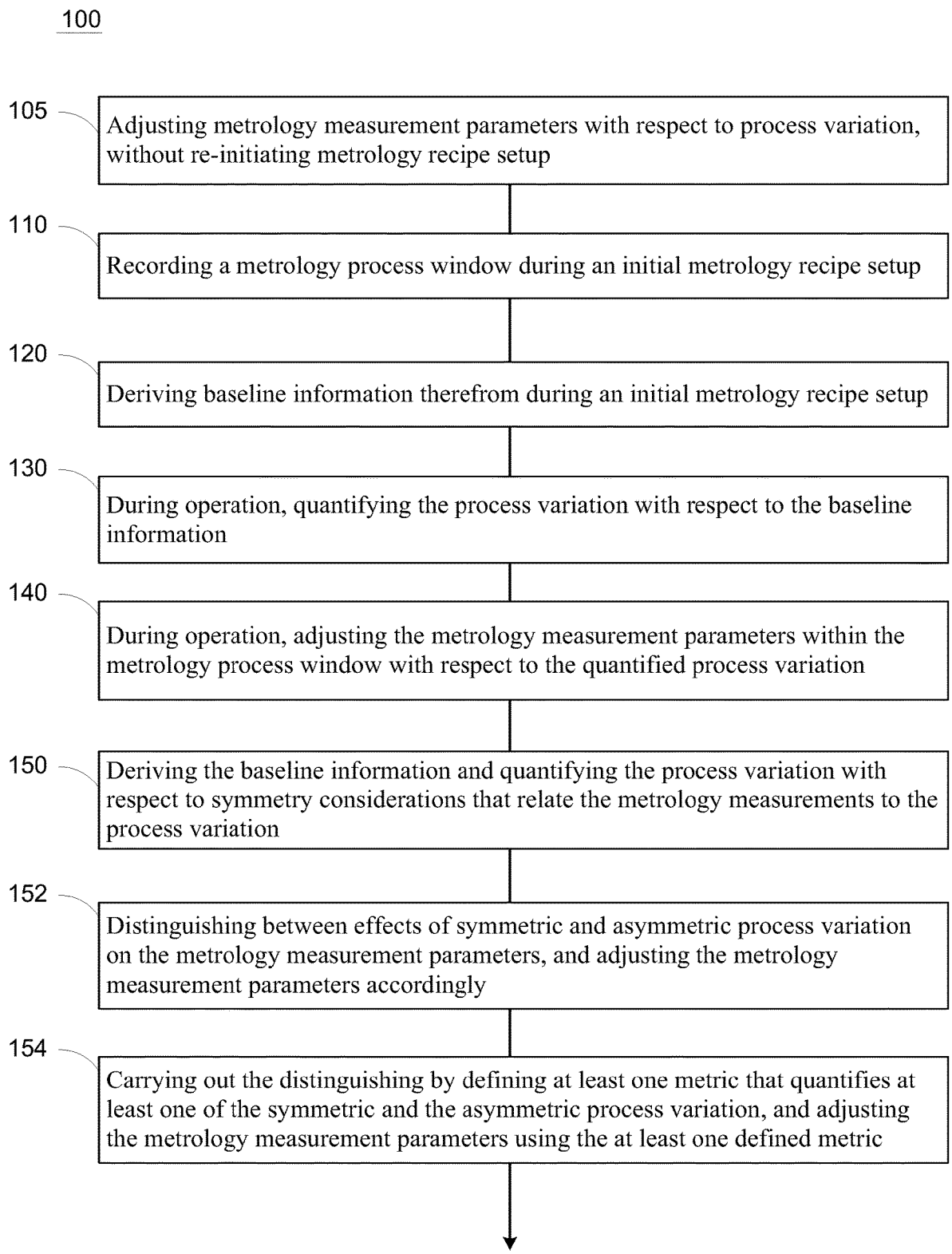
FIG. 6 is a high-level flowchart illustrating methods of adjusting metrology measurement parameters with respect to process variation, without re-initiating metrology recipe setup, according to some embodiments of the invention.
Figure 6:
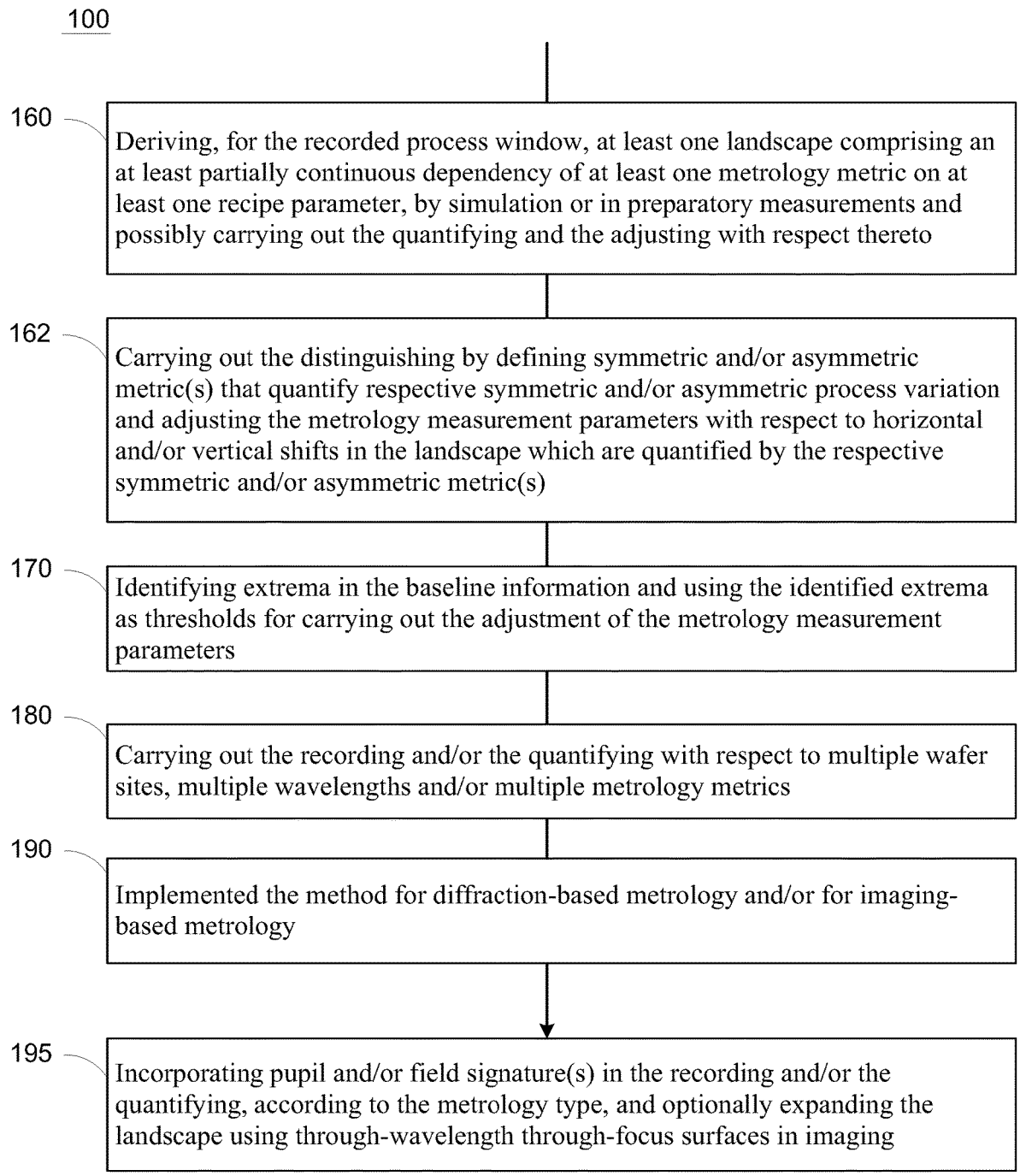

FIG. 6 is a high-level flowchart illustrating method 100, according to some embodiments of the invention. Metrology tools or modules may be configured to implements any of the following stages of method 100, irrespective of their order. Method 100 may be at least partially implemented by at least one computer processor, e.g., in a metrology module. Certain embodiments comprise computer program products comprising a computer readable storage medium having computer readable program embodied therewith and configured to carry out the relevant stages of method 100.

Method 100 may comprise adjusting metrology measurement parameters with respect to process variation, without re-initiating metrology recipe setup (stage 105), by recording (stage 110), during an initial metrology recipe setup, a metrology process window and deriving baseline information therefrom (stage 120), and, during operation—quantifying the process variation with respect to the baseline information (stage 130), and adjusting the metrology measurement parameters within the metrology process window with respect to the quantified process variation (stage 140).

Method 100 may further comprise deriving the baseline information and quantifying the process variation with respect to symmetry considerations that relate the metrology measurements to the process variation (stage 150). Method 100 may further comprise distinguishing between effects of symmetric and asymmetric process variation on the metrology measurement parameters, and adjusting the metrology measurement parameters accordingly (stage 152). Distinguishing 152 may be carried out by defining at least one metric that quantifies at least one of the symmetric and the asymmetric process variation, and adjusting the metrology measurement parameters using the at least one defined metric (stage 154).

Certain embodiments comprise deriving, for the recorded process window, at least one landscape comprising an at least partially continuous dependency of at least one metrology metric on at least one recipe parameter, by simulation or in preparatory measurements and possibly carrying out the quantifying and the adjusting with respect thereto (stage 160). The at least one landscape may be discrete, continuous, one dimensional, at least two dimensional or combinations thereof in different parts of the landscape(s).

Distinguishing 152 may be carried out by defining at least one symmetric metric that quantifies the symmetric process variation and at least one asymmetric metric that quantifies the asymmetric process variation, and adjusting the metrology measurement parameters with respect to horizontal shifts in the landscape which are quantified by the defined at least one symmetric metric and to vertical shifts in the landscape which are quantified by the defined at least one asymmetric metric (stage 162).

Method 100 may further comprise identifying extrema in the baseline information and using the identified extrema as thresholds for carrying out the adjustment of the metrology measurement parameters (stage 170).

In certain embodiments, recording 110 and/or quantifying 130 may be carried out with respect to multiple wafer sites, multiple wavelengths and/or multiple metrology metrics (stage 180).

Method 100 may be implemented for diffraction-based metrology and/or for imaging-based metrology (stage 190). In the former case, method 100 may further comprise incorporating at least one pupil signature in recording 110 and/or quantifying 130; and/or incorporating at least one field signature in recording 110 and/or quantifying 130. In the latter case, incorporating at least one field signature in recording 110 and/or quantifying 130; and/or expanding the landscape using through-wavelength through-focus surfaces in imaging (stage 195).

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A method of adjusting metrology measurement parameters with respect to process variation, without re-initiating metrology recipe setup, the method comprising:
   during an initial metrology recipe setup, recording a metrology process window and deriving baseline information therefrom, wherein the metrology process window is expressed to quantify dependency of metrology measurement results on measurement parameters, and wherein the baseline information is from an initial recipe setup,
   during operation, quantifying the process variation with respect to the baseline information, and adjusting the metrology measurement parameters within the metrology process window with respect to the quantified process variation,
   distinguishing between effects of symmetric and asymmetric process variation on the metrology measurement parameters, and adjusting the metrology measurement parameters accordingly, and
   deriving, for the recorded metrology process window, at least one landscape comprising an at least partially continuous dependency of at least one metrology metric on at least one recipe parameter by simulation or in preparatory measurements, wherein the distinguishing is carried out by defining at least one symmetric metric that quantifies the symmetric process variation and at least one asymmetric metric that quantifies the asymmetric process variation, and adjusting the metrology measurement parameters with respect to horizontal shifts in the landscape which are quantified by the defined at least one symmetric metric and to vertical shifts in the landscape which are quantified by the defined at least one asymmetric metric.

2. The method of claim 1, wherein deriving the baseline information and quantifying the process variation are performed with respect to symmetry considerations that relate the metrology measurements to the process variation.

3. The method of claim 1, wherein the distinguishing is carried out by defining at least one metric that quantifies at least one of the symmetric and the asymmetric process variation, and adjusting the metrology measurement parameters using the at least one defined metric.

4. The method of claim 1, further comprising identifying extrema in the baseline information and using the identified extrema as thresholds for carrying out the adjustment of the metrology measurement parameters.

5. The method of claim 1, wherein the recording and the quantifying are carried out with respect to multiple wafer sites, multiple wavelengths and/or multiple metrology metrics.

6. The method of claim 1, implemented for diffraction-based metrology and further comprising incorporating at least one pupil signature in the recording and the quantifying.

7. The method of claim 1, implemented for diffraction-based metrology and further comprising incorporating at least one field signature in the recording and the quantifying.

8. The method of claim 1, implemented for imaging-based metrology and further comprising incorporating at least one field signature in the recording and the quantifying.

9. The method of claim 1, further comprising carrying out the quantifying and the adjusting with respect to the at least one landscape.

10. The method of claim 9, wherein the at least one landscape is at least two dimensional.

11. The method of claim 9, implemented for imaging-based metrology and further comprising expanding the landscape using through-wavelength through-focus surfaces in imaging.

12. The method of claim 1, wherein at least one of: the recording, the deriving, the quantifying and the adjusting is carried out by at least one computer processor.

13. A computer program product comprising a non-transitory computer readable storage medium having computer readable program embodied therewith, the computer readable program configured to carry out the method of claim 1.

14. A metrology tool comprising the computer program product of claim 13.

* * * * *